US009176811B2

(12) United States Patent
Nakanishi et al.

(10) Patent No.: US 9,176,811 B2
(45) Date of Patent: Nov. 3, 2015

(54) STORAGE CONTROL APPARATUS, STORAGE APPARATUS, INFORMATION PROCESSING SYSTEM, AND STORAGE CONTROL METHOD

(71) Applicant: Sony Corporation, Tokyo (JP)

(72) Inventors: Kenichi Nakanishi, Tokyo (JP); Yasushi Fujinami, Tokyo (JP); Keiichi Tsutsui, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 48 days.

(21) Appl. No.: 14/030,016

(22) Filed: Sep. 18, 2013

(65) Prior Publication Data

US 2014/0122972 A1    May 1, 2014

(30) Foreign Application Priority Data

Oct. 29, 2012   (JP) ................................. 2012-237383

(51) Int. Cl.
*G11C 29/42*    (2006.01)
*G06F 11/10*    (2006.01)
*G11C 13/00*    (2006.01)
*G11C 29/54*    (2006.01)
*G11C 29/04*    (2006.01)

(52) U.S. Cl.
CPC ........ *G06F 11/1048* (2013.01); *G11C 13/0002* (2013.01); *G11C 13/004* (2013.01); *G11C 2029/0411* (2013.01)

(58) Field of Classification Search
CPC ............ G06F 11/1048; G06F 11/1016; G06F 11/1068; G06F 11/1072; G06F 11/1076; G06F 11/1008; G11C 13/0002; G11C 13/004; G11C 2029/0411
See application file for complete search history.

(56) References Cited

U.S. PATENT DOCUMENTS

| 6,725,322 | B1* | 4/2004 | Shiraishi et al. ............... 711/103 |
| 2004/0223395 | A1* | 11/2004 | Huang ........................... 365/222 |
| 2009/0300236 | A1* | 12/2009 | Lee ................................ 710/60 |
| 2011/0026385 | A1* | 2/2011 | Nakai et al. ................. 369/47.32 |
| 2014/0013187 | A1* | 1/2014 | Blaunstein .................... 714/773 |

FOREIGN PATENT DOCUMENTS

JP    2011-165297 A    8/2011

* cited by examiner

*Primary Examiner* — April Y Blair
*Assistant Examiner* — Dipakkumar Gandhi
(74) *Attorney, Agent, or Firm* — Hazuki International, LLC

(57) ABSTRACT

A storage control apparatus includes a standard read request unit, an error correcting unit, and a high-accuracy read request unit. The standard read request unit is configured to issue a request for a read with standard accuracy to a read address in a memory. The error correcting unit is configured to perform error correction on the basis of an error correcting code and data returned by the memory in response to the read request with the standard accuracy. The high-accuracy read request unit is configured to issue, when an error incapable of being corrected by the error correction is caused, a request again for a read with higher accuracy than the standard accuracy to the read address.

16 Claims, 12 Drawing Sheets

STORAGE CONTROL APPARATUS, STORAGE APPARATUS, INFORMATION PROCESSING SYSTEM, AND STORAGE CONTROL METHOD

CROSS REFERENCE TO RELATED APPLICATIONS

This application claims the benefit of Japanese Priority Patent Application JP 2012-237383 filed Oct. 29, 2012, the entire contents of each which are incorporated herein by reference.

BACKGROUND

The present disclosure relates to a storage control apparatus. Specifically, the present disclosure relates to a storage control apparatus that performs storage control for a memory that stores an error correcting code along with data, a storage apparatus, and a processing method therefor.

From the past, such a technology that a storage (auxiliary storage apparatus) is further provided to an information processing system including a processor and a work memory thereof (main storage apparatus) to increase a storage capacity has been developed. In the information processing system, a DRAM (dynamic random access memory) or the like is used as a work memory. On the other hand, a non-volatile memory (NVM) may be sometimes used as a storage. The non-volatile memory is roughly classified into a flash memory that deals with a data access on a large size basis and a non-volatile random access memory (NVRAM) capable of performing a rapid random access on a small size basis. Here, as a typical example of a flash memory, a NAND flash memory is cited. On the other hand, examples of a non-volatile RAM include a PCRAM (phase-change RAM), an MRAM (magneto-resistive RAM), a ReRAM (resistance RAM), and the like.

In a non-volatile memory in related art, in addition to a typical read method, a read method having high accuracy but involving a read time has been proposed (see, for example, Japanese Patent Application Laid-open No. 2011-165297). That is, a dynamic read, which is a typical high-speed read method having relatively low accuracy, and a static read, which is a relatively low-speed read method having high accuracy, are disclosed.

SUMMARY

A non-volatile memory has such a mechanism that repeated write and read accesses lead to deterioration thereof. Data read from a cell in such a state may be read with a bit error included. Therefore, under the influence of the states of cells, a bit error caused may vary depending on read operation results. For example, in the case where certain data is stored in a deteriorated cell, when a high-speed dynamic read operation is performed, the number of bit errors is likely to increase. In this case, in related art described above, there is no means to detect bit errors in a non-volatile memory device, and it may be impossible to improve a result of read data because read operations are allocated by purpose. The state in which data stored in the non-volatile memory is not read correctly means that the information is lost, which is a fatal condition as a system. That is, as an effective means for preventing this, the read method having high accuracy is not fully exploited.

In view of the above-mentioned circumstances, it is desirable to control a read request depending on an error correction state in a memory that deals with both of a read with standard accuracy and a read with high accuracy.

According to an embodiment of the present disclosure, there is provided a storage control apparatus including a standard read request unit, an error correcting unit, and a high-accuracy read request unit. The standard read request unit is configured to issue a request for a read with standard accuracy to a read address in a memory. The error correcting unit is configured to perform error correction on the basis of an error correcting code and data returned by the memory in response to the read request with the standard accuracy. The high-accuracy read request unit is configured to issue, when an error incapable of being corrected by the error correction is caused, a request again for a read with higher accuracy than the standard accuracy to the read address. Further, there is provided a storage control method therefor. With this structure, in the case where the error correction is incapable of being performed in the read with the standard accuracy with respect to the memory, the read with the high accuracy is requested to the memory.

Further, in the embodiment, the storage control apparatus may further include a recording unit configured to record the read address in a case where errors are entirely corrected by the error correction, and a bit count of the errors corrected satisfies a certain requirement. When a new read address in accordance with a new read request is recorded in the recording unit, the read request with the high accuracy may be issued to the new read address without issuing the read request with the standard accuracy. As a result, the high-accuracy read is performed for the address in which the bit count of the errors corrected satisfies the certain requirement. In this case, when the bit count of the errors corrected exceeds a predetermined threshold value, the recording unit may determine that the certain requirement is satisfied and record the read address.

Further, in this embodiment, when the read address corresponds to a predetermined address area, the read request with the high accuracy may be issued to the read address without issuing the read request with the standard accuracy. As a result, the read with the high accuracy is performed in accordance with the address area. In this case, the predetermined address area can be a system area.

Further, in the embodiment, the error correcting unit may perform the error correction for data having a first size on the basis of a first error correcting code and performs the error correction for data having a second size larger than the first size on the basis of a second error correcting code with a higher correction capability than the first error correcting code, and when the read request to the read address has a size equal to or smaller than the first size, the read request with the high accuracy may be issued to the read address without issuing the read request with the standard accuracy. As a result, the read with the high accuracy is performed in the case where the data size does not exceed the first size.

Further, in the embodiment, when an access frequency to the read address satisfies a certain requirement, the read request with the high accuracy may be issued to the read address without issuing the read request with the standard accuracy. As a result, the read with the high accuracy is performed in accordance with the access frequency.

Further, in the embodiment, the storage control apparatus may further include a refreshing request unit configured to issue a refreshing request to the read address in a case where errors are entirely corrected by the error correction, and a bit count of the errors corrected satisfies a certain requirement. As a result, the refreshing operation is performed for the address in which the bit count of the errors corrected satisfies the certain requirement. In this case, the refreshing request unit may give, as the refreshing request, an instruction to perform a read with the higher accuracy than the standard accuracy in the read address to write a read result in the read address. As a result, the read for the refreshing is performed with high accuracy.

According to another embodiment of the present disclosure, there is provided a storage apparatus including a memory, a standard read request unit, an error correcting unit, and a high-accuracy read request unit. The memory is configured to deal with a read request for both of a read with standard accuracy and a read with higher accuracy than the standard accuracy. The standard read request unit is configured to issue a request for the read with the standard accuracy to a read address in the memory. The error correcting unit is configured to perform error correction on the basis of an error correcting code and data returned by the memory in response to the read request with the standard accuracy. The high-accuracy read request unit is configured to issue, when an error incapable of being corrected by the error correction is caused, a request again for a read with higher accuracy than the standard accuracy to the read address. As a result, in the case where the error correction is incapable of being performed in the read with the standard accuracy, the read with the high accuracy is performed.

According to another embodiment of the present disclosure, there is provided an information processing system including a memory, a host computer, a standard read request unit, an error correcting unit, and a high-accuracy read request unit. The memory is configured to deal with a read request for both of a read with standard accuracy and a read with higher accuracy than the standard accuracy. The host computer is configured to issue a read access to the memory. The standard read request unit is configured to issue a request for the read with the standard accuracy to a read address in the memory in response to the read access. The error correcting unit is configured to perform error correction on the basis of an error correcting code and data returned by the memory in response to the read request with the standard accuracy. The high-accuracy read request unit is configured to issue, when an error incapable of being corrected by the error correction is caused, a request again for a read with higher accuracy than the standard accuracy to the read address. As a result, at the time of performing the read access to the memory from the host computer, in the case where the error is incapable of being corrected in the read with the standard accuracy, the read with the high accuracy is performed.

According to the embodiments of the present disclosure, it is possible to exert such an excellent effect that, in the memory that deals with both of the read with the standard accuracy and the read with the high accuracy, the read request can be controlled in accordance with the error correction state.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure will be described with reference to the drawings. The description will be performed in the following order.

1. First embodiment (basic control)
2. Second embodiment (example of control based on error correction log)
3. Third embodiment (example of control based on access area)
4. Fourth embodiment (example of control in case where error correcting code is doubled)
5. Fifth embodiment (example of control based on access frequency)
6. Sixth embodiment (example of control that also uses refreshing operation)
7. Modified example <1. First embodiment>

Figure 1:
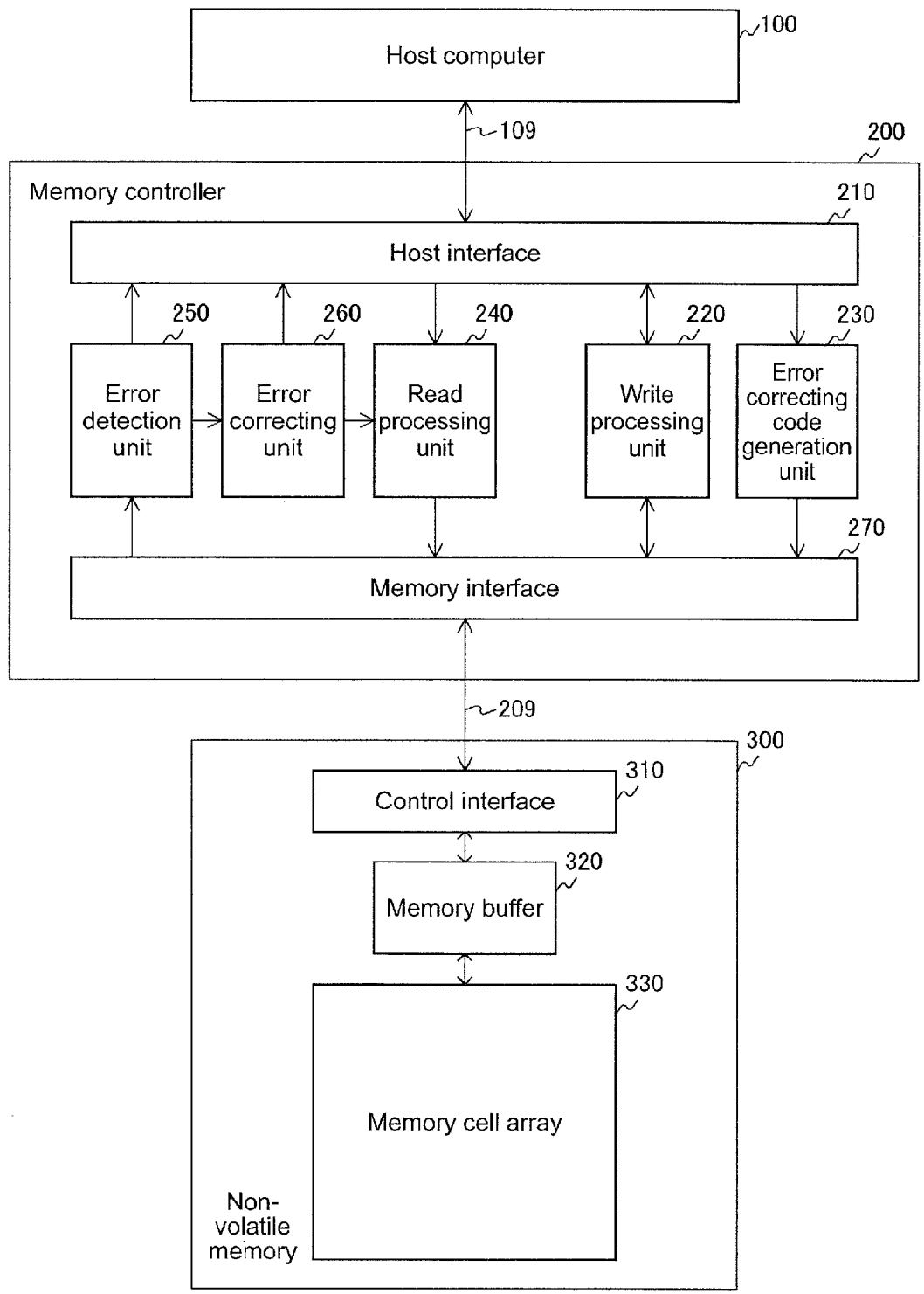
FIG. 1 is a diagram showing an example of the structure of an information processing system in an embodiment of the present disclosure.

FIG. 1 is a diagram showing an example of the structure of an information processing system in an embodiment of the present disclosure. The information processing system is provided with a host computer 100, a memory controller 200, and a non-volatile memory 300. The memory controller 200 and the non-volatile memory 300 constitute a memory system. The host computer 100 issues an command for requesting a read, a write, or the like of data with respect to the memory system.

The non-volatile memory 300 is a memory (NVM) having a non-volatile property for continuously holding a content thereof even in a state where power is not supplied. The non-volatile memory 300 is roughly classified into a flash memory that deals with data accesses on a large size basis and a non-volatile random access memory (NVRAM) capable of performing high-speed random accesses on a small size basis. Here, as a typical example of the flash memory, a NAND flash memory is cited. On the other hand, examples of the NVRAM include a PCRAM, an MRAM, a ReRAM, and the like.

The non-volatile memory 300 is provided with a control interface 310, a memory buffer 320, and a memory cell array 330. In the memory cell array 330, memory cells that store data values of bits are arranged in a matrix pattern. The memory cells have a non-volatile memory for continuously holding a content even in a state where power is not supplied. The memory buffer 320 is a buffer for holding data to be written in the memory cell array 330 or data read from the memory cell array 330. The control interface 310 is an interface that performs transmission and reception with the memory controller 200.

The memory cell array 330 has two ream methods (read modes) with different accuracy types. One is a normal high-speed read method with relatively low accuracy. An access by this read method is referred to as a normal access. The other is a relatively low-speed read method with high accuracy. An access by this read method is referred to as a high-accuracy access. Which read method is to be used is determined in accordance with an instruction from the memory control 200.

The memory controller 200 is used to control the non-volatile memory 300. In accordance with an instruction from the host computer 100, a read request, a write request, or the like is issued to the non-volatile memory 300. The memory controller 200 is provided with a host interface 210, a write processing unit 220, an error correcting code generation unit 230, a read processing unit 240, an error detection unit 250, an error correcting unit 260, and a memory interface 270.

The write processing unit 220 writes data into the non-volatile memory 300. The write processing unit 220 issues a write request to the non-volatile memory 300 in response to a write command from the host computer 100. The write command from the host computer 100 includes a write address to be a target of the write processing. The memory controller 200 may convert the write address from a logical address to a physical address or may output the address as it is. In an ordinary case, the write data as the target of the write processing is included in the write command from the host computer 100 or instructed along with the write command. In addition, in the case where a refreshing process is performed, data read by the read processing unit 240 may be sometimes used as the write data.

The error correcting code generation unit 230 generates an error correcting code (ECC) for the write data. The error correcting code generated is written in the non-volatile memory 300.

The read processing unit 240 performs processing for reading data from the non-volatile memory 300. The read processing unit 240 issues a read request to the non-volatile memory 300 in accordance with the read command from the host computer 100. The read command from the host computer 100 includes a read address as a target of the read process. The memory controller 200 may convert the read address from the logical address to the physical address or may output the address as it is. Through the read process, read data as the target and the error correcting code therefor are read from the non-volatile memory 300. It should be noted that the read processing unit 240 is an example of a standard read request unit and a high-accuracy read request unit described in the scope of the appended claims.

The error detection unit 250 detects a bit error on the basis of the read data and the error correcting code read from the non-volatile memory 300. The error correcting unit 260 corrects the bit error on the basis of the read data and the error correcting code read from the non-volatile memory 300 in the case where the bit error is detected in the error detection unit 250. As a result, by the error correcting unit 260, bit errors of bit counts within the correction capability range of the error correcting code are corrected, and data holding characteristics are improved. However, if a bit error out of the correction capability range of the error correcting code is generated, it may be impossible to correct the bit error.

The host interface 210 is an interface for performing transmission and reception with respect to the host computer 100. The memory interface 270 is an interface for performing transmission and reception with respect to the non-volatile memory 300.

Figure 2:
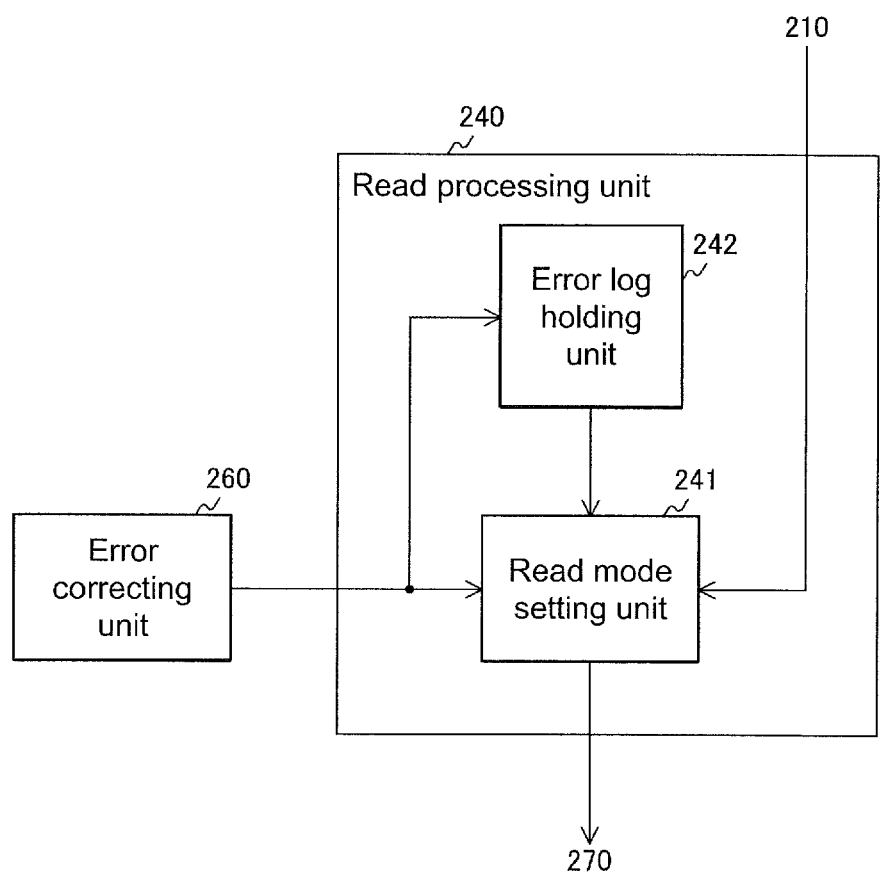
FIG. 2 is a diagram showing an example of the structure around a read processing unit in the embodiment of the present disclosure.

FIG. 2 is a diagram showing an example of the structure around the read processing unit 240 in the embodiment of the present disclosure. The read processing unit 240 includes a read mode setting unit 241 and an error log holding unit 242.

The read mode setting unit 241 sets one of the read modes of the normal access and the high-accuracy access when issuing the read request to the non-volatile memory 300. Which one of the read modes is to be set is determined depending on whether the error correction can be performed or not by the error correcting unit 260, the type of the read access from the host computer 100, or the like. The determination will be described below in detail.

The error log holding unit 242 holds an error correction condition in the error correcting unit 260 as the error log. The error log holding unit 242 will be described in detail in a second embodiment. It should be noted that the error log holding unit 242 is an example of a recording unit described in the scope of the appended claims.

(Operation of Read Process)

Figure 3:
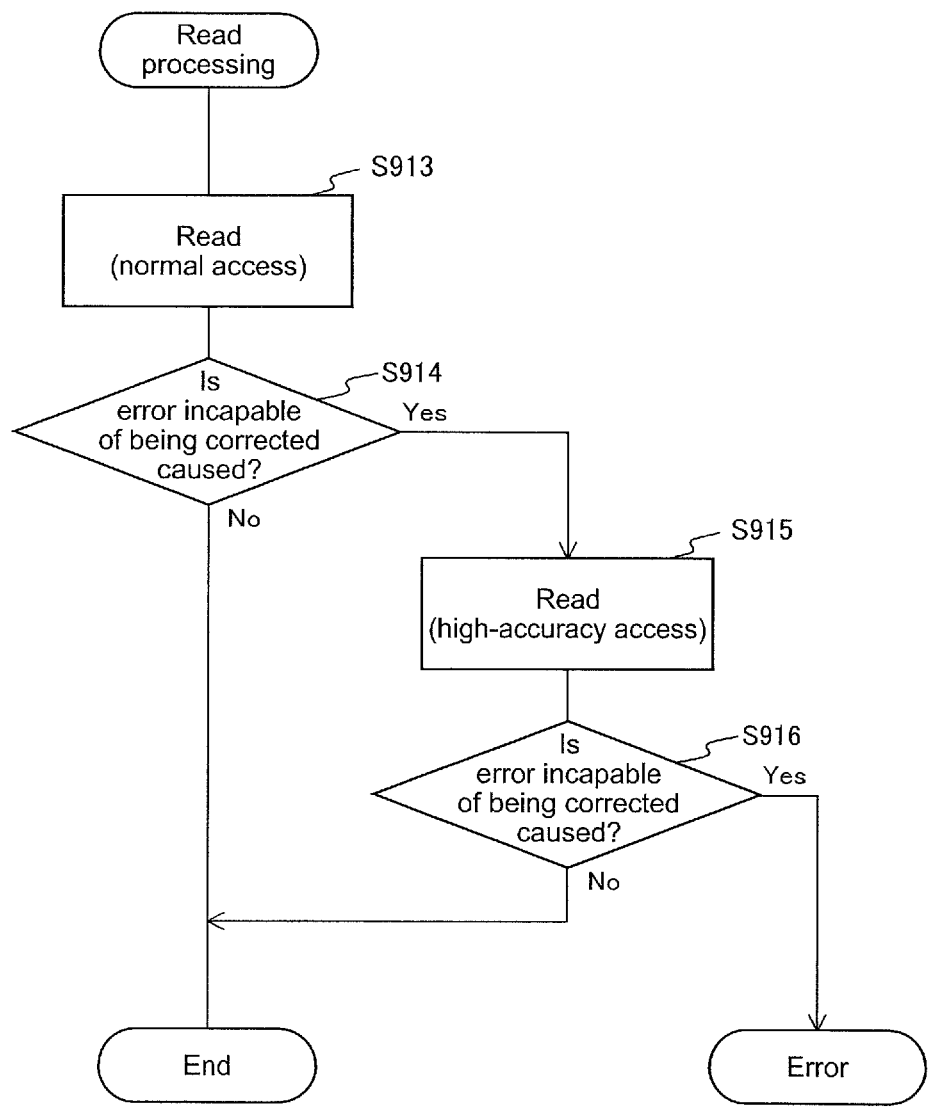
FIG. 3 is a flowchart showing a procedure example of a read process of an information processing system in the first embodiment of the present disclosure.

FIG. 3 is a flowchart showing a procedure example of the read process of the information processing system in the first embodiment of the present disclosure. In the first embodiment, upon reception of a read command from the host computer 100, the read processing unit 240 issues a read request to a read address in the non-volatile memory 300 (Step S913). In this case, in the read mode setting unit 241, the normal access is set as the read mode. That is, by the setting, in the non-volatile memory 300, the normal high-speed read method having relatively low accuracy is used to perform the read access.

When the read by the normal access is performed in non-volatile memory 300, read data and an error correcting code thereof are supplied to the error detection unit 250. The error detection unit 250 detects whether there is an error or not on the basis of the read data and the error correcting code thereof. Then, in the case here the occurrence of the error is detected, the error correcting unit 260 performs the error correction on the basis of the read data and the error correcting code thereof. As a result, in the case where an error which is difficult to be corrected in the error correcting unit 260 is caused (Yes in Step S914), the read processing unit 240 issues a read request by the high-accuracy access to the same read address in the non-volatile memory 300 (Step S915). As described above, in the error correcting unit 260, only the number of bit errors within the correction capability range of the error correcting code can be accepted, and it may be impossible to perform the error correction for the bit errors exceeding the bit count. Even in such a case, by using the high-accuracy access to read the data again, the bit error count is decreased, with the result that it may become possible to correct the bit error by the error correcting unit 260. Therefore, in Step S915, the read by the high-accuracy access, which is more highly accurate than the normal access, is performed for the same read address.

When the read by the high-accuracy access is performed, the read data and the error correcting code thereof are supplied to the error detection unit 250. On the basis of the read data and the error correcting code thereof, the error detection unit 250 detects whether an error is generated or not. If the error occurrence is detected, the error correcting unit 260 performs the error correction on the basis of the read data and the error correcting code thereof. As a result, in the case where an error which is difficult to be corrected is generated in the error correcting unit 260 (Yes in Step S916), an error termination of the read process is carried out.

In the case where the error is not detected in the error detection unit 250, or in the case where the error is detected, but the error correction succeeds in the error correcting unit 260 (No in Step S914 or No in Step 916), a normal termination of the read process is carried out.

In this way, according to the first embodiment of the present disclosure, it is possible to improve the correction capability for the data by combining the read mode and the error correction. That is, in the case where the error correction is difficult to be performed by the read by the normal access, the read by the high-accuracy access is performed, thereby making it possible to decrease the bit error count and increase the possibility that the error correction can be performed. On the other hand, by setting a first read access to the normal access, which involves a shorter access time period, it is possible to minimize an influence to the access performance.

<2. Second embodiment>

In the first embodiment described above, each time the read command is received, the read by the normal access is performed first, and only when the error correction is incapable of being performed, the read by the high-accuracy access is performed. In the second embodiment, by referring to an error log created by the error correcting unit 260, the normal access is omitted depending on a situation, and the read by the high-accuracy access is performed from the start. It should be noted that the basic structure of the information processing system is the same as that described with reference to FIGS. 1 and 2, so the description thereof will be omitted.

(Structure of Error Log Holding Unit)

Figure 4:
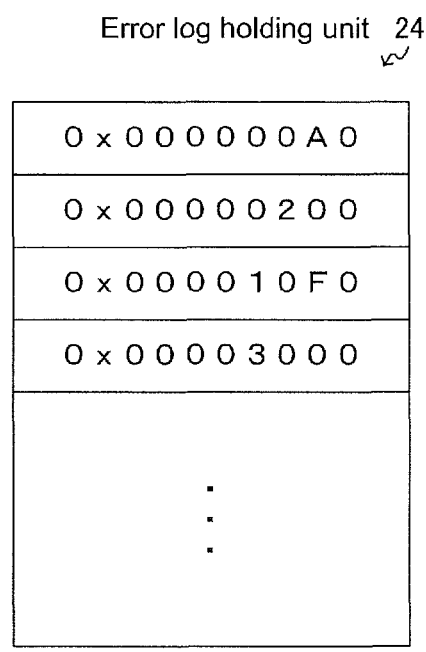
FIG. 4 is a diagram showing an example of the structure of an error log holding unit in a second embodiment of the present disclosure.

FIG. 4 is a diagram showing an example of the structure of the error log holding unit 242 in the second embodiment of the present disclosure. In the case where the bit count of the bit errors corrected by one error correction in the error correcting unit 260 exceeds a predetermined threshold value, the error log holding unit 242 records and manages the read addresses thereof as the error correction log. In this example, read addresses at which the bit count of the bit errors caused exceeds the predetermined threshold value are held in hexadecimal. In the case where the read process is performed for the read address in the non-volatile memory recorded on the log, by using the high-accuracy access, it is possible to prevent an occurrence of an error incapable of being corrected.

It should be noted that in this example, the structure in which the error log holding unit 242 holds the read addresses themselves is considered, but another structure can be used. For example, the following structure may be used. That is, a bit map corresponding to the read addresses is prepared, and corresponding flags in the bit map are on.

(Operation of Read Process)

Figure 5:
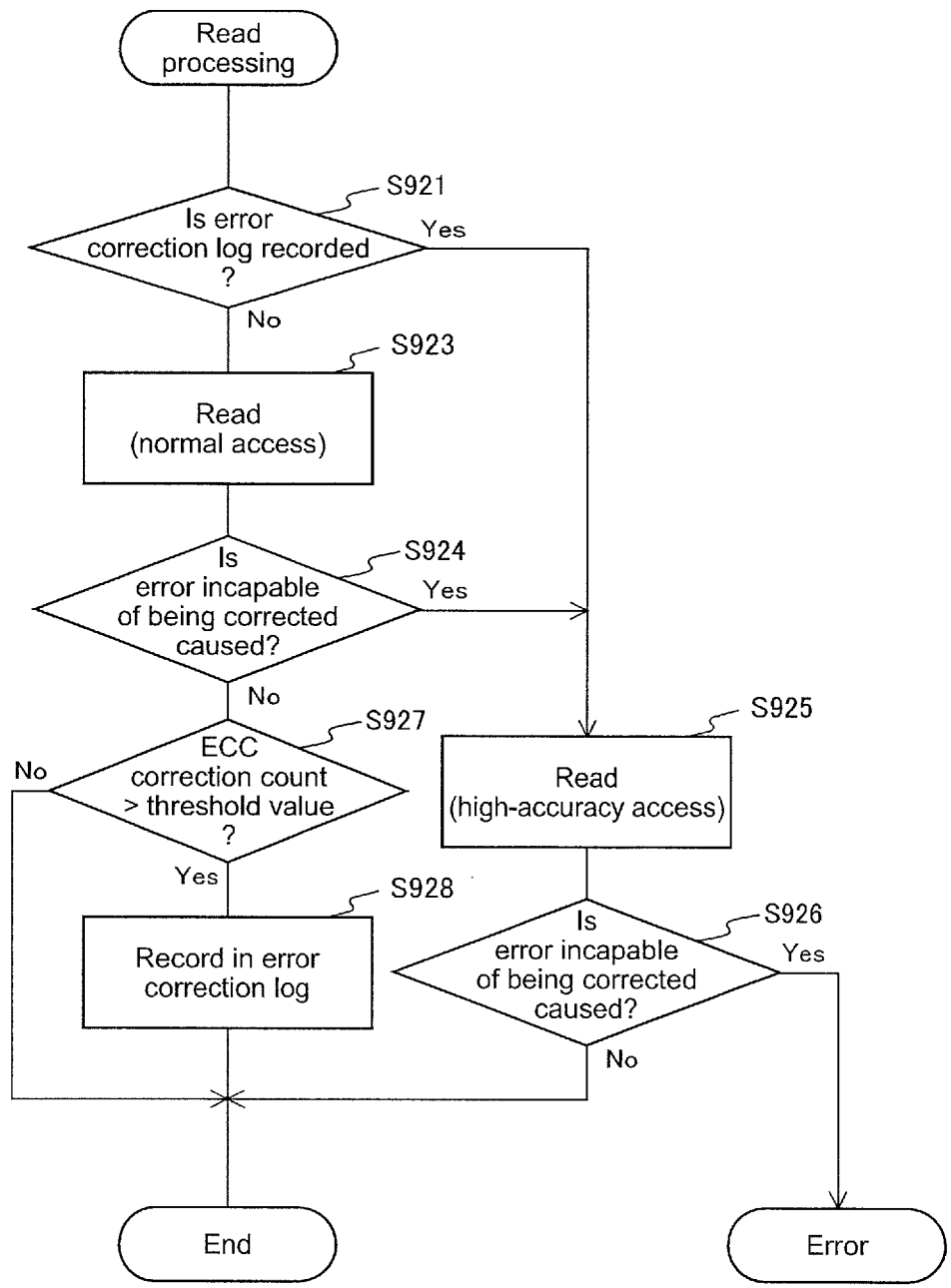
FIG. 5 is a flowchart showing a procedure example of a read process of an information processing system in the second embodiment of the present disclosure.

FIG. 5 is a flowchart showing a procedure example of the read process of an information processing system in the second embodiment of the present disclosure. In the second embodiment, upon reception of the read command from the host computer 100, the read processing unit 240 determines whether the read address is recorded in the error log holding unit 242 or not by referring to the error log holding unit 242.

When the read address is not recorded in the error log holding unit 242 (No in Step S921), the read request is issued by the normal access (Step S923). On the other hand, when the read address is recorded in the error log holding unit 242 (Yes in Step S921), the normal access is skipped, and the read request by the high-accuracy access is issued (Step S925).

In Step S923, when the read by the normal access is performed, the read data and the error correcting code thereof are supplied to the error detection unit 250. The error detection unit 250 detects whether the error occurs or not on the basis of the read data and the error correcting code thereof. In the case where the occurrence of the error is detected, on the basis of the read data and the error correcting code thereof, the error correcting unit 260 performs the error correction. As a result, in the case where the error incapable of being corrected is caused in the error correcting unit 260 (Yes in Step S924), the read processing unit 240 issues the read request with high accuracy to the same read address in the non-volatile memory 300 (Step S925).

In the case where the error is not detected for the read by the normal access, or in the case where the error is detected, but the error correction succeeds in the error correcting unit 260 (No in Step S924), the normal termination of the read process is performed. When the bit count of the errors corrected exceeds the predetermined threshold value in the case where the error correction is performed (Yes in Step S927), the read address is recorded as the error correction log in the error log holding unit 242 (Step S928). The error correction log indicates addresses at which errors may probably become incapable of being corrected in the future. The error correction log is checked in Step S921, and when the address is recorded in the error correction log, the normal access (Step S923) is skipped, and the read by the high-accuracy access (Step S925) is performed.

In Step S925, when the read by the high-accuracy access is performed, the read data and the error correcting code thereof are supplied to the error detection unit 250. The error detection unit 250 detects whether the error occurs or not on the basis of the read data and the error correcting code thereof. In the case where the occurrence of the error is detected, on the basis of the read data and the error correcting code thereof, the error correcting unit 260 performs the error correction. As a result, in the case where the error incapable of being corrected is caused in the error correcting unit 260 (Yes in Step S926), the error termination of the read process is carried out.

In the case where the error is not detected for the read by the high-accuracy access, or in the case where when the error is detected, but the error correction succeeds in the error correcting unit 260 (No in Step S926), the normal termination of the read process is carried out.

As described above, according to the second embodiment of the present disclosure, by recording the addresses at which errors may probably become incapable of being corrected in the future as the error correction log, the normal access is skipped, and high-accuracy access is performed, with the result that it is possible to prevent an occurrence of the error incapable of being corrected.

<3. Third embodiment>

In the first embodiment, regardless of the area of the address as the read target, the read by the normal access is performed first, and only when it may be impossible to correct the error, the read by the high-accuracy access is performed. In the third embodiment, depending on an address as the read target, the normal access is omitted, and the read by the high-accuracy access is performed from the start. It should be noted that the basic structure of the information processing system is the same as that described with reference to FIGS. 1 and 2, so the description thereof will be omitted.

(Address Space)

Figure 6:
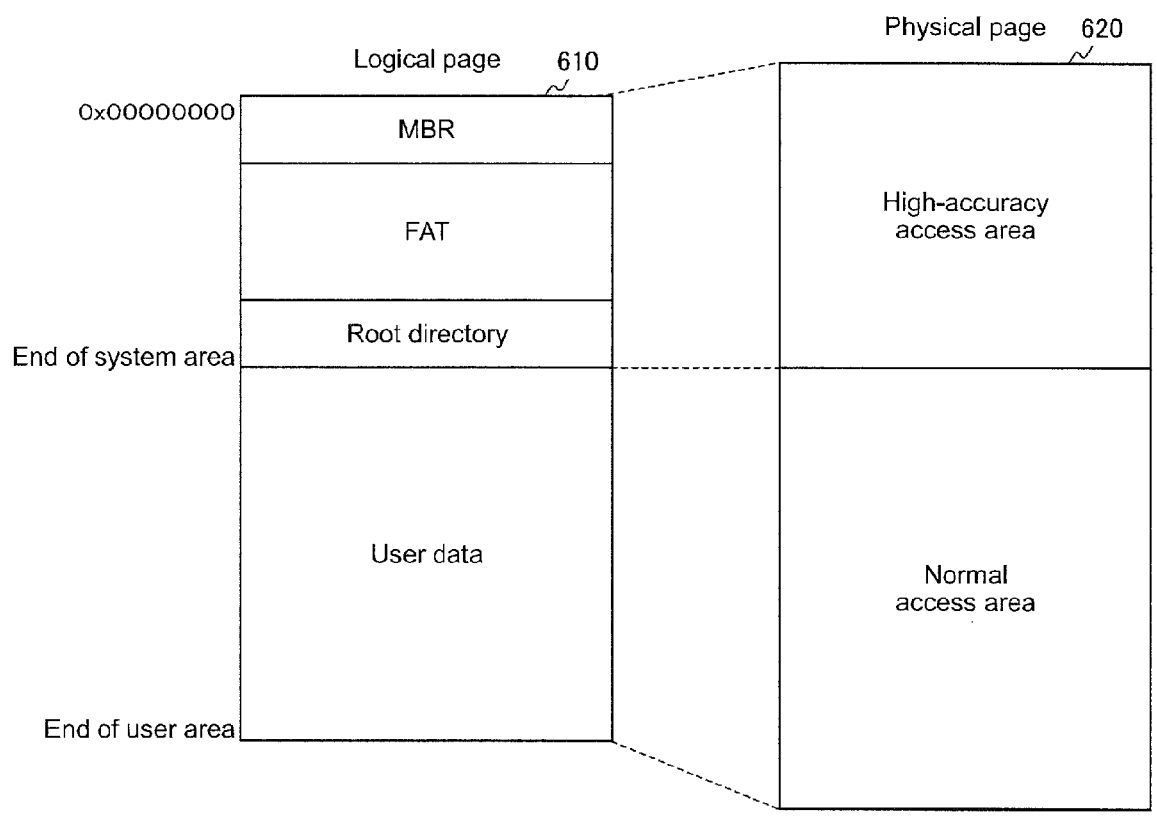
FIG. 6 is a diagram showing an example of a correspondence relationship between a logical page and a physical page assumed in a third embodiment of the present disclosure.

FIG. 6 is a diagram showing an example of a correspondence relationship between a logical page and a physical page assumed in the third embodiment of the present disclosure. In the third embodiment, the assumption is made that the non-volatile memory is used as a storage apparatus, a logical page 610 is mapped for a physical page 620, and an access is performed. It is necessary to normally read management information of a file system or the like that manages the area as the storage apparatus, and for the data area, an address space that indicates an area as a logical format is fixed in advance. In view of this, for the management information, the high-accuracy access is preferentially performed, thereby suppressing an occurrence of the error incapable of being corrected.

The logical page 610 is divided into a system area and a user area. In the system area, an MBR (master boot record) is an area initially read at the time of starting the system. An FAT (file allocation table) is a table for managing a storage position of a file. A root directory is an area for storing a directory entry of a file that exists in an uppermost order in a hierarchical directory structure. User data is stored in the user area.

The physical page 620 is divided into a high-accuracy access area, in which the high-accuracy access is preferentially performed, and a normal access area, in which the normal access is preferentially performed. The system area is allocated to the high-accuracy access area, and the user area is allocated to the normal access area. As a result, at the time of accessing the system area, the high-accuracy access is preferentially performed, and at the time of accessing the user area, the normal access is preferentially performed.

(Operation of Read Process)

Figure 7:
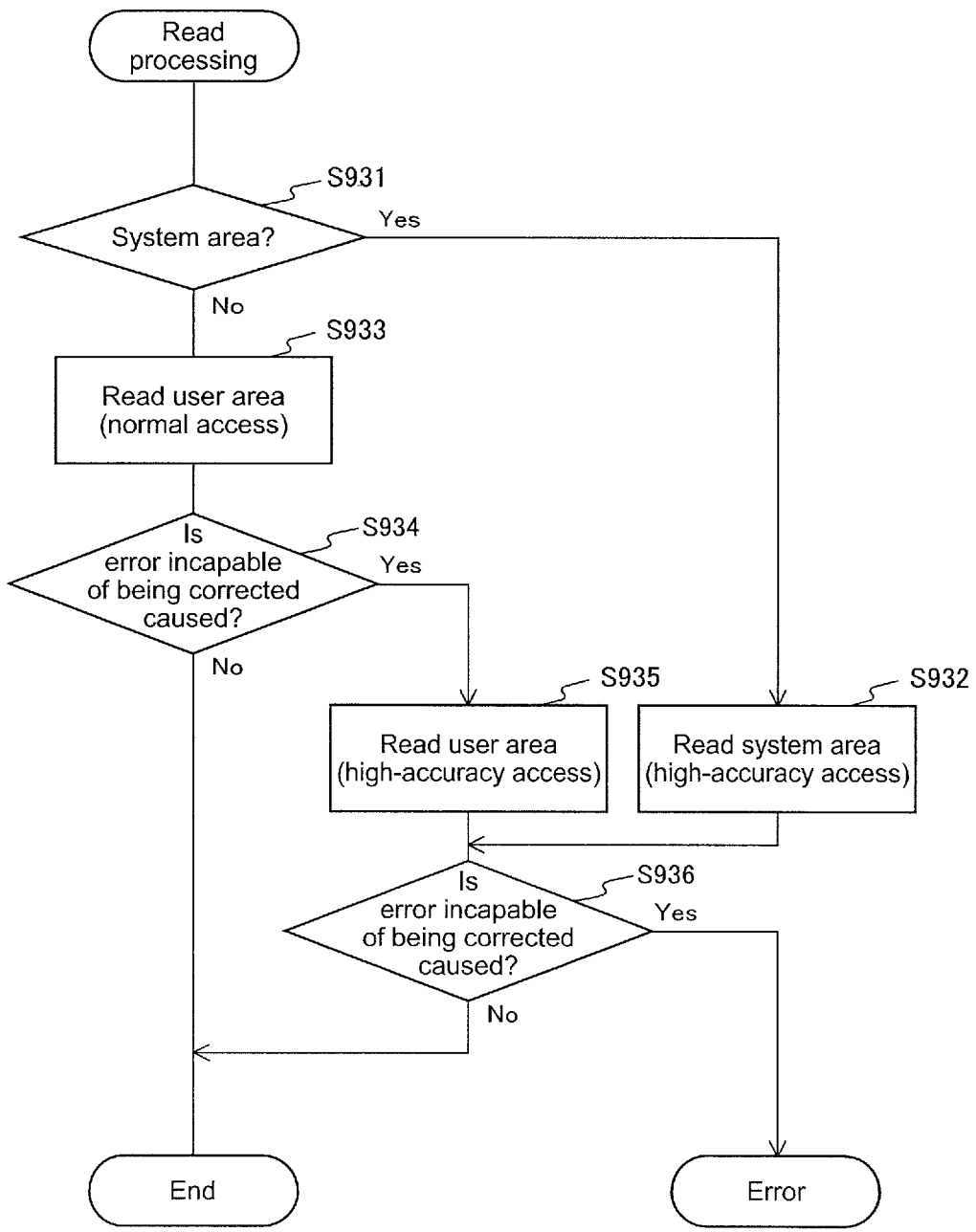
FIG. 7 is a flowchart showing a procedure example of a read process of an information processing system in the third embodiment of the present disclosure.

FIG. 7 is a flowchart showing a procedure example of the read process of an information processing system in the third embodiment of the present disclosure. In the third embodiment, upon reception of the read command from the host computer 100, the read processing unit 240 determines whether the read address thereof exceeds an end of the system area or not.

If the read address exceeds the end of the system area (No in Step S931), this corresponds to the user area, so the read request is issued by the normal access (Step S933). On the other hand, if the read address does not exceed the end of the system area (Yes in Step S931), this corresponds to the system area, so the normal access is skipped, and the read request by the high-accuracy access is issued (Step S932).

In Step S933, when the read by the normal access is performed, the read data and the error correcting code thereof are supplied to the error detection unit 250. The error detection unit 250 detects whether the error is caused or not on the basis of the read data and the error correcting code thereof. When the occurrence of the error is detected, the error correcting unit 260 performs the error correction on the basis of the read data and the error correcting code. As a result, in the read correction unit 260, in the case where the error incapable of being corrected is caused (Yes in Step S934), the read processing unit 240 issues the read request by the high-accuracy access to the same read address in the non-volatile memory 300 (Step S935).

When the read by the high-accuracy access is performed in Step S932 or S935, the read data and the error correcting code thereof are supplied to the error detection unit 250. The error detection unit 250 detects whether the error is caused or not on the basis of the read data and the error correcting code thereof. In the case where the occurrence of the error is detected, the error correcting unit 260 performs the error correction on the basis of the read data and the error correcting code thereof. As a result, in the error correcting unit 260, in the case where the error incapable of being corrected is caused (Yes in Step S936), the error termination of the read process is carried out.

In the case where the error is not detected in the error detection unit 250, or in the case where the error is detected, but the error correction succeeds in the error correcting unit 260 (No in Step S934 or No in Step S936), the normal termination of the read process is carried out.

As described above, according to the third embodiment of the present disclosure, for the access to the system area, the normal access is skipped, and the high-accuracy access is performed, thereby making it possible to prevent an occurrence of the error incapable of being corrected.

<4. Fourth embodiment>

In the first embodiment described above, the error correcting code handled by the error correcting code generation unit 230, the error detection unit 250, and the error correcting unit 260 is one type. That is, on the assumption that one error correcting code is used regardless of a size or the like of the read target, the read by the normal access is performed first, and only when it may be impossible to correct the error, the read by the high-accuracy access is carried out. In a fourth embodiment, a first error correcting code in a unit of 512 bytes and a second error correcting code in a unit of 4096 bytes are given. Generally, the longer the code length of the error correcting code, the higher the error correction capability becomes. Here, the second error correcting code in the unit of 4096 bytes has a higher error correction capability than the first error correcting code in the unit of 512 bytes. In the fourth embodiment, the double error correcting codes are considered, for the access method that uses the error correcting code in the unit of 512 bytes having relatively low correction capability, the normal access is omitted, and the read by the high-accuracy access is performed from the start. It should be noted that the basic structure of the information processing system is the same as that described with reference to FIGS. 1 and 2, so the description thereof will be omitted.

(Error Correcting Code)

Figure 8:
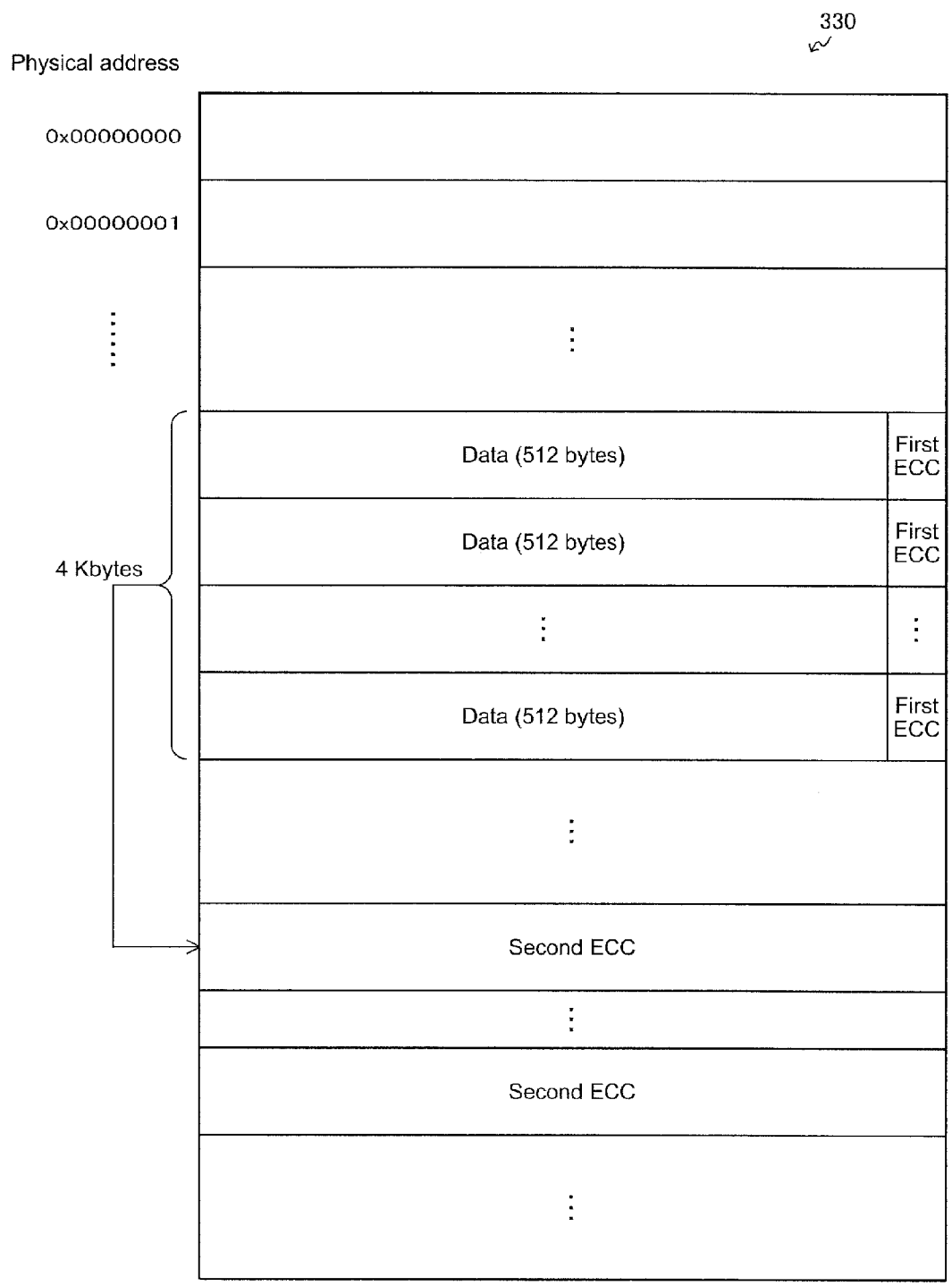
FIG. 8 is a diagram showing an example of a correspondence relationship between data and an error correcting code assumed in a fourth embodiment of the present disclosure.

FIG. 8 is a diagram showing an example of a correspondence relationship between data and the error correcting code (ECC) assumed in the fourth embodiment of the present disclosure. In the fourth embodiment, for data having a first size, the error correction based on the first error correcting code is performed. Further, for data having a second size larger than the first size, the error correction based on the second error correcting code having the higher correction capability is performed. Hereinafter, as an example, the assumption is made that the first size and the second size are 512 bytes and 4 Kbytes, respectively.

To each 512 byte data 331, a first ECC 332 is given. To eight sets, each of which is constituted of the 512 byte data 331 and the first ECC 332, a second ECC 333 is given. That is, in the case of the 4 Kbyte data is used as a unit, in addition to the first ECC 332, the second ECC 333 having a higher correction capability is given, thereby improving the data holding characteristics. In other words, even in the case where it may be impossible to perform the correction by the first ECC 332, by using the second ECC 333, it is possible to read data after the correction. In this case, the second ECC 333 applies an error correcting code having the high correction capability to the data of the eight sets, each of which is constituted of the 512 byte data 331 and the first ECC 332.

As the first ECC 332, for example, a parity that allows 1 bit error detection and correction with respect to 512 bytes is considered. As the second ECC 333, for example, a BCH code that allows 8 bit error detection and collection with respect to 4 Kbyte data is considered.

In the case where the read in the unit of 512 bytes is performed, it takes a short time to perform the bit error detection and a correction process by the parity. Therefore, by applying the high-accuracy access, the possibility that an error that exceeds 1 bit is caused is reduced. On the other hand, in the case where the read in the unit of 4 Kbytes is performed, the correction capability by the BCH code is sufficiently high, and it takes a longer time to perform the bit error detection and the correction process. Therefore, the normal access, which involves higher speed, is used. As a result, it is possible to suppress the increase of an access time even in the case where the second ECC 333 becomes necessary.

It should be noted that in this example, the first ECCs 332 are disposed immediately after each 512 byte data 331, and the second ECCs 333 are collectively disposed separately, but the first ECCs 332 and the second ECCs 333 may be disposed at any storage positions.

(Operation of Read Process)

Figure 9:
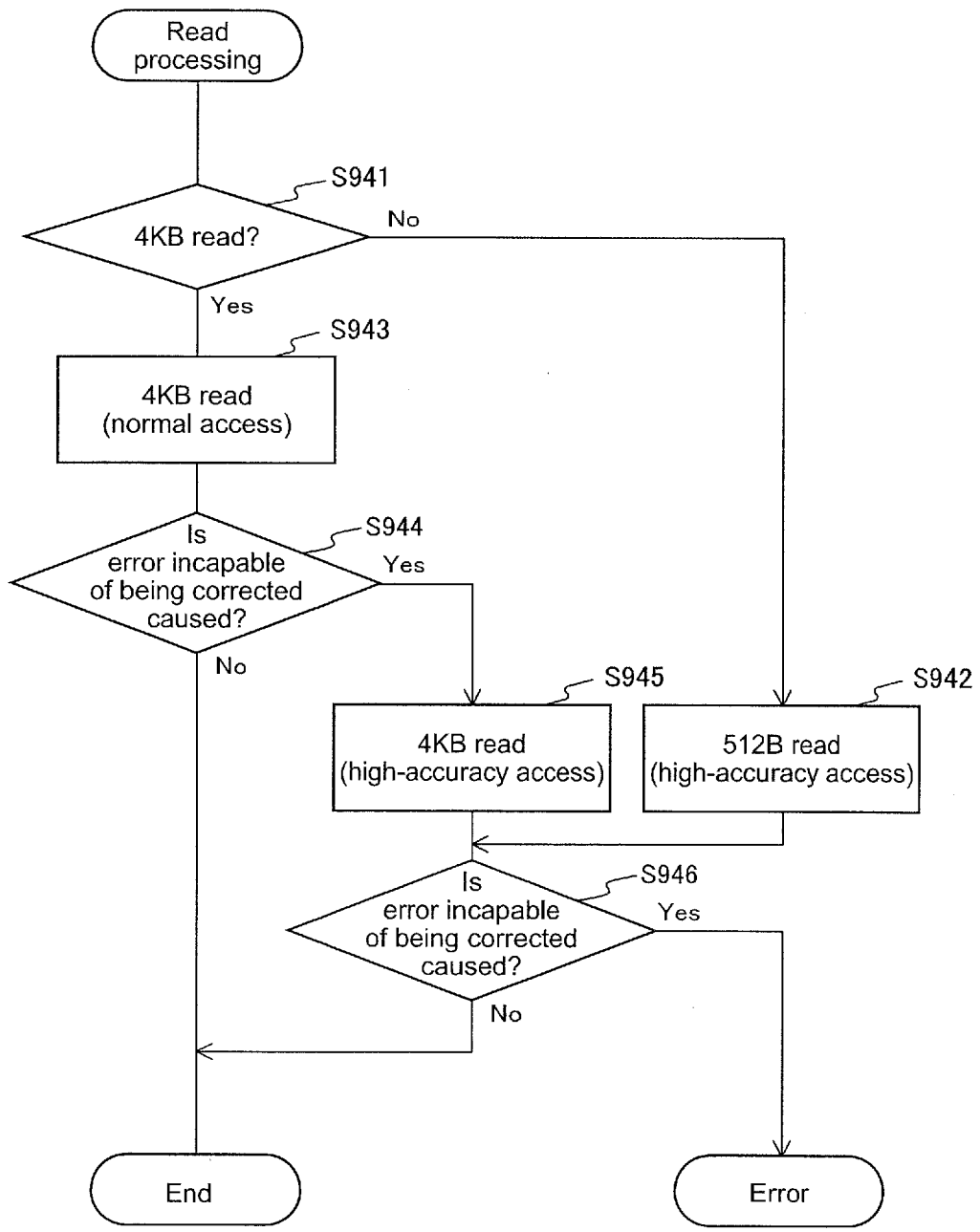
FIG. 9 is a flowchart showing a procedure example of a read process of an information processing system in the fourth embodiment of the present disclosure.

FIG. 9 is a flowchart showing a procedure example of the read process of the information processing system in the fourth embodiment of the present disclosure. In the fourth embodiment, when the read processing unit 240 receives the read command from the host computer 100, a size of data to be read is referred to.

If the data size exceeds 512 bytes (Yes in Step S941), the data corresponds to the 4 Kbyte data read, so the read request of 4 Kbytes by the normal access is issued (Step S943). On the other hand, in the case where the data size does not exceed 512 bytes (No in Step S941), the data corresponds to the 512 byte read, so the normal access is skipped, and the read request of 512 bytes is issued by the high-accuracy access (Step S942).

When the read by the normal access is performed in Step S943, the 4 Kbyte data and the second error correcting code are supplied to the error detection unit 250. On the basis of the 4 Kbyte data and the second error correcting code, the error detection unit 250 detects whether the error is caused or not. In the case where the occurrence of the error is detected, the error correcting unit 260 performs the error correction on the basis of the 4 Kbyte data and the second error correcting code. As a result, in the case where the error incapable of being corrected is caused in the error correcting unit 260 (Yes in Step S944), the read processing unit 240 issues the read request by the high-accuracy access to the same read address on the non-volatile memory 300 (Step S945).

In Step S942, when the read by the high-accuracy access is performed, the 512 byte data and the first error correcting code are supplied to the error detection unit 250. The error detection unit 250 detects whether the error is caused or not on the basis of the 512 byte data and the first error correcting code. In the case where the occurrence of the error is detected, the error correcting unit 260 performs the error correction on the basis of the 512 byte data and the first error correcting code. On the other hand, in Step S945, when the read by the high-accuracy access is performed, 4 Kbyte data and the second error correcting code are supplied to the error detection unit 250. The error detection unit 250 detects whether the error is caused or not on the basis of the 4 Kbyte data and the second error correcting code. In the case where the occurrence of the error is detected, the error correcting unit 260 performs the error correction on the basis of the 4 Kbyte data and the second error correcting code. As a result of the error corrections, if the error incapable of being corrected is caused in the error correcting unit 260 (Yes in Step S946), the error termination of the read process is carried out.

In the case where the error is not detected in the error detection unit 250, or in the case where the error is detected, but the error correction succeeds in the error correcting unit 260 (No in Step S944 or No in Step S946), the normal termination of the read process is carried out.

As described above, according to the fourth embodiment of the present disclosure, for the read access having a size with a low correction capability, the normal access is skipped, and the high-accuracy access is carried out, with the result that it is possible to prevent the occurrence of the error incapable of being corrected.

<5. Fifth embodiment>

In the first embodiment described above, regardless of the type of the data to be read, the read by the normal access is performed first, and only when the error correction is difficult to be performed, the read by the high-accuracy access is performed. In a fifth embodiment, depending on the type of data to be read, the normal access is omitted, and the read by the high-accuracy access is performed from the start. It should be noted that the basic structure of the information processing system is the same as that described with reference to FIGS. 1 and 2, so the description thereof will be omitted.

In the fifth embodiment, the data is classified into two types of hot data and cold data. The hot data is frequently accessed from the host computer 100, and the cold data is not frequently accessed therefrom. That is, because the hot data is frequently accessed, it is necessary to shorten an access time, so the normal access is applied thereto. On the other hand, the high-accuracy access is applied to the cold data, because a long-term storage may deteriorate a holding characteristic. It should be noted that, to determine whether the data is the hot data or the cold data, a method of managing access logs to the data, a method of specifying the data type as an attribute of an area in which the data is stored from the host computer 100.

(Operation of Read Process)

Figure 10:
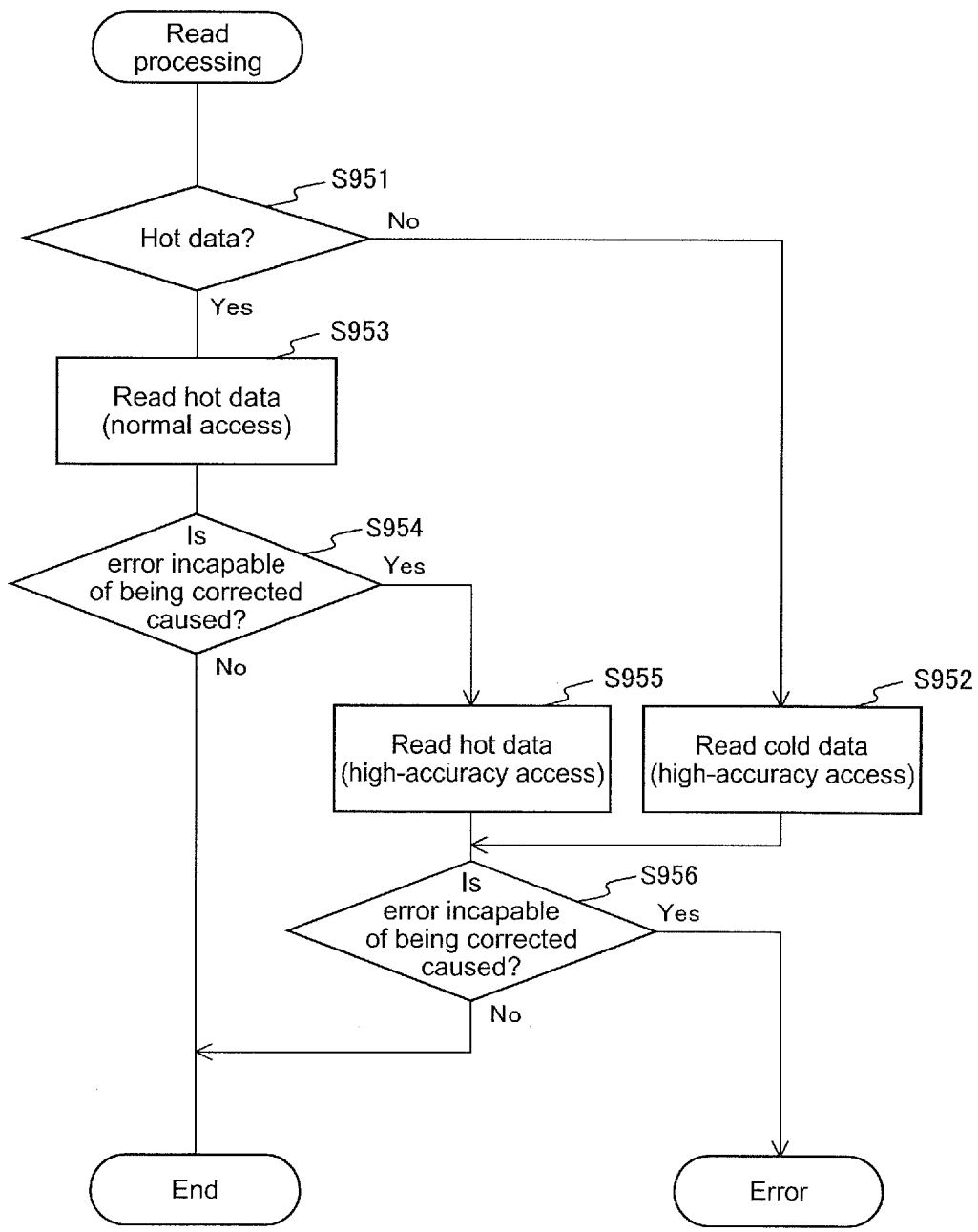
FIG. 10 is a flowchart showing a procedure example of a read process of an information processing system in a fifth embodiment of the present disclosure.

FIG. 10 is a flowchart showing a procedure example of the read process of an information processing system in the fifth embodiment of the present disclosure. In the fifth embodiment, when the read processing unit 240 receives a read command from the host computer 100, whether the read data is the hot data or the cold data is determined. Whether the data is the hot data or the cold data can be determined by various methods. For example, in the case where the read command includes information, the determination can be performed from the information. In the case where, when data to be accessed and read is recorded, a write command includes information, and the memory controller holds the information, the determination can be performed from the information held. Further, in the case where, after write processing, by a command different from the read command and the write command, information for corresponding data is instructed to the memory controller, the determination can be performed from the information instructed. Alternatively, the memory controller may count an access frequency or the like to perform the determination.

In the case where the read data corresponds to the hot data (Yes in Step S951), the read request is issued by the normal access (Step S953). On the other hand, the read data corresponds to the cold data (No in Step S951), the normal access is skipped, and the read request by the high-accuracy access is issued (Step S952).

In Step S953, when the read by the normal access is performed, the read data and the error correcting code are supplied to the error detection unit 250. The error detection unit 250 detects whether the error is caused or not on the basis of the read data and the error correcting code. In the case where the occurrence of the error is detected, the error correcting unit 260 performs the error correction on the basis of the read data and the error correcting code. As a result, if the error incapable of being corrected is caused in the error correcting unit 260 (Yes in Step S954), the read processing unit 240 issues the read request by the high-accuracy access to the same address in the non-volatile memory 300 (Step S955).

When the read by the high-accuracy access is performed in Step S952 or Step S955, the read data and the error correcting code are supplied to the error detection unit 250. On the basis of the read data and the error correcting code, the error detection unit 250 detects whether the error is caused or not. In the case where the occurrence of the error is detected, the error correcting unit 260 performs the error correction on the basis of the read data and the error correcting code. As a result, if the error incapable of being corrected is caused in the error correcting unit 260 (Yes in Step S956), the error termination of the read process is carried out.

In the case where the error is not detected in the error detection unit 250, or in the case where the error is detected, but the error correction succeeds in the error correcting unit 260 (No in Step S954 or No in Step S956), the normal termination of the read process is carried out.

As described above, according to the fifth embodiment of the present disclosure, for the access to the cold data, the normal access is skipped, and the high accuracy access is performed, with the result that it is possible to prevent the occurrence of the error incapable of being corrected.

<6. Sixth embodiment>

The fact is known that data stored in a non-volatile memory deteriorates as a storage period thereof becomes longer, and a holding characteristic thereof is refreshed by writing the data again. In view of this, in a sixth embodiment, in the read by the normal access, if a correction count of bit errors exceeds a predetermined threshold value, it is determined that a memory cell thereof has to be refreshed. It is necessary to read correct data in the refreshing operation. The refreshing operation is not performed by a data access from a host computer, and therefore a long read time presents no problem, so it is possible to apply the high-accuracy access thereto. It should be noted that the basic structure of the information processing system is the same as that described with reference to FIGS. 1 and 2, so the description thereof will be omitted.

(Operation of Read Process)

Figure 11:
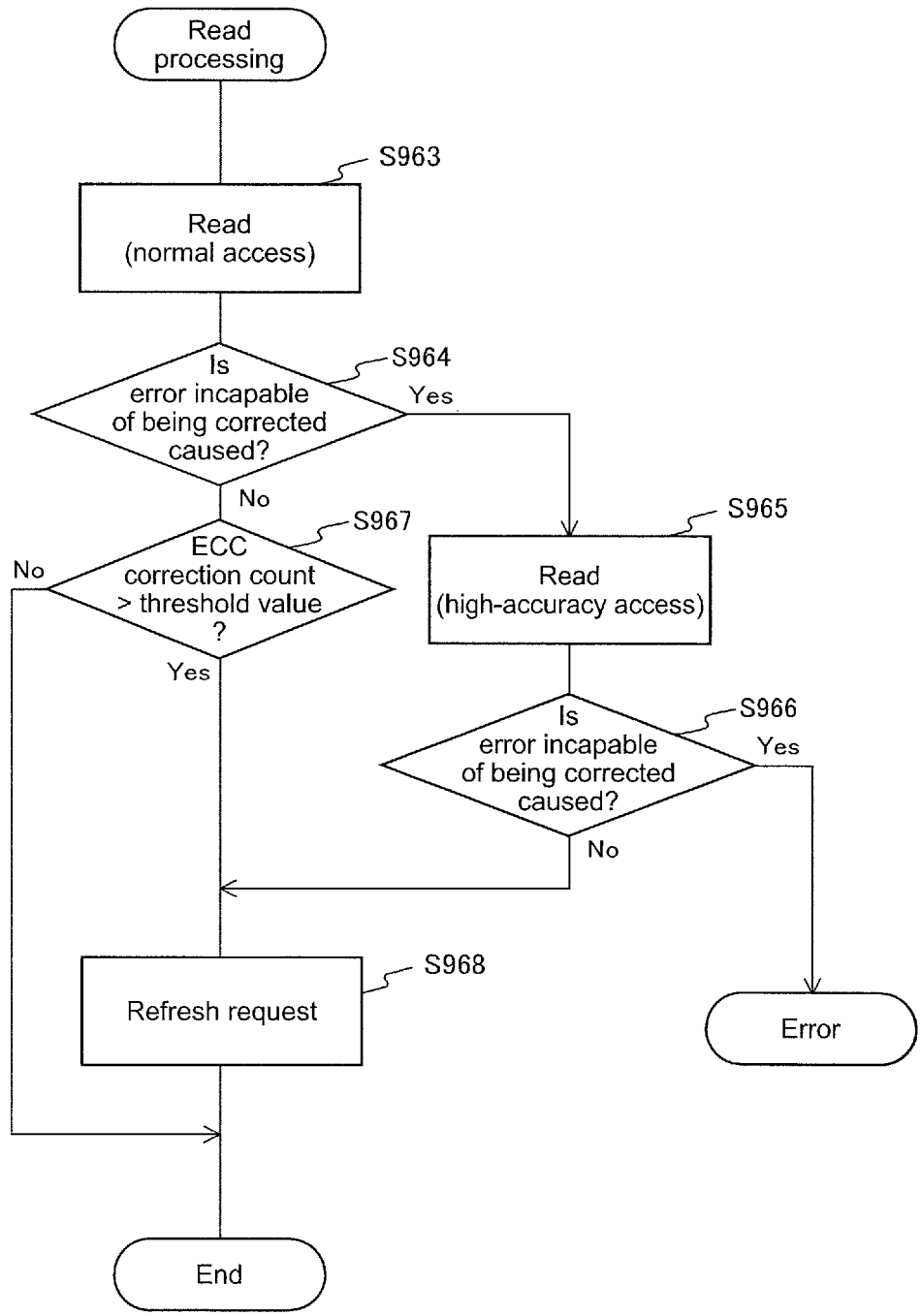
FIG. 11 is a flowchart showing a procedure example of a read process of an information processing system in a sixth embodiment of the present disclosure.

FIG. 11 is a flowchart showing a procedure example of the read process of the information processing system in the sixth embodiment of the present disclosure. In the sixth embodiment, when receiving the read command from the host computer 100, the read processing unit 240 issues a read request to the read address in the non-volatile memory 300 (Step S963). In this case, in the read mode setting unit 241, the normal access is set as the read mode. That is, by this operation, in the non-volatile memory 300, the read access is performed by the high-speed normal read method with relatively low accuracy.

In Step S963, when the read by the normal access is performed, the read data and the error correcting code thereof are supplied to the error detection unit 250. The error detection unit 250 detects whether the error is caused or not on the basis of the read data and the error correcting code thereof. In the case where the occurrence of the error is detected, the error correcting unit 260 performs the error correction on the basis of the read data and the error correcting code thereof. As a result, in the case where the error incapable of being corrected is caused in the error correcting unit 260 (Yes in Step S964), the read processing unit 240 issues the read request by the high-accuracy access to the same read address on the non-volatile memory 300 (Step S965).

In the case where the error is not detected for the read by the normal access, or in the case where the error is detected, but the error correction succeeds in the error correcting unit 260 (No in Step S964), the normal termination of the read process is carried out. In the case where the error correction is performed, when the bit count of the error corrected exceeds the predetermined threshold value (Yes in Step S967), the read processing unit 240 performs the refreshing process for the non-volatile memory 300 (Step S968), and the normal termination of the read process is carried out.

In Step S965, when the read by the high-accuracy access is performed, the read data and the error correcting code are supplied to the error detection unit 250. The error detection unit 250 detects whether the error is caused or not on the basis of the read data and the error correcting code. In the case where the occurrence of the error is detected, the error correcting unit 260 performs the error correction on the basis of the read data and the error correcting code. As a result, in the case where the error incapable of being corrected is caused in the error correcting unit 260 (Yes in Step S966), the error termination of the read process is carried out.

In the case where the error is not detected for the read by the high-accuracy access, or in the case where the error is detected, and the error correction succeeds in the error correcting unit 260 (No in Step S966), the refreshing process is carried out (Step S968). After that, the normal termination of the read process is carried out.

It should be noted that in the case where the error incapable of being corrected is caused in Step S964, the error termination may be carried out without performing the read (Step S965) by the high-accuracy access. Further, in this case, a refreshing request may be issued without performing the read (Step S965) by the high-accuracy access, as in Step S968.

(Operation of Refreshing Process)

Figure 12:
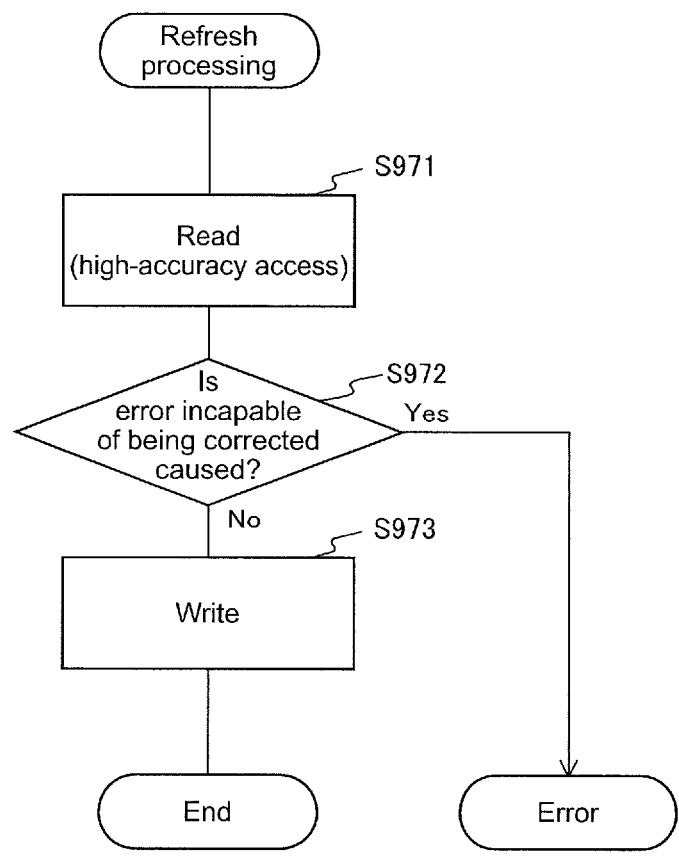
FIG. 12 is a flowchart showing a procedure example of a refreshing process of the information processing system in the sixth embodiment of the present disclosure.

FIG. 12 is a flowchart showing a procedure example of the refreshing process (Step S968) of the information processing system in the sixth embodiment of the present disclosure. In the refreshing process, the read by the high-accuracy access is performed from the refreshment address in the non-volatile memory 300 (Step S971). When the read by the high-accuracy access is performed, the read data and the error correcting code are supplied to the error detection unit 250. The error detection unit 250 detects whether the error is caused or not on the basis of the read data and the error correcting code thereof. Then, in the case where the occurrence of the error is detected, the error correcting unit 260 performs the error correction on the basis of the read data and the error correcting code thereof. As a result, in the case where the error incapable of being corrected is caused in the error correcting unit 260 (Yes in Step S972), the error termination of the read process is carried out.

On the other hand, in the case where the error is not detected for the read by the high-accuracy access in Step S971, or in the case where the error is detected, but the error correction succeeds in the error correcting unit 260 (No in Step S972), the read data corrected is written in the same address (Step S973). As a result, the refreshing operation is completed, and the normal termination of the processing is carried out.

As described above, according to the sixth embodiment of the present disclosure, by performing the refreshing operation for the address in which the error may probably be incapable of being corrected in the future, it is possible to prevent the occurrence of the error incapable of being corrected.

<7. Modified example>

In the above embodiments, as a barometer of the probability that the error may become incapable of being examples can be conceived.

For example, in the case where a holding characteristic of a cell is instable in high temperature, an ambient temperature is set as the barometer. By applying the high-accuracy access is applied to the case where a read process at a temperature higher than a certain threshold value is performed, it is possible to prevent the read process from failing due to the occurrence of the error incapable of being corrected.

In addition, in the case where a cell increasingly deteriorates as the number of rewrites is increased, the number of rewrites is set as the barometer. By applying the high-accuracy access in the case where the number of rewrites exceeds the certain threshold value, it is possible to prevent the read process from failing due to the occurrence of the error incapable of being corrected.

Further, in the case where data stored in a cell deteriorates as the holding period of the data becomes longer, the holding period is set as the barometer. By applying the high-accuracy access in the case where the holding period exceeds a threshold value, it is possible to prevent the read process from failing due to the error incapable of being corrected.

It should be noted that in the above embodiments, the description is given on the assumption that the accuracy in the read process is improved in two steps, and in the case of the improvements in three or four or more steps, expansion thereof is easily performed, and an effect thereof can be increased.

It should be noted that the above embodiments are the examples for specifying the present technology. The items in the embodiments correspond to the disclosure specifying items in the scope of claims. In the same way, the disclosure specifying items in the scope of claims correspond to the items of the same names in the embodiments of the present disclosure. However, the present disclosure is not limited to the embodiments and can have variously modified embodiments without departing from the gist of the present disclosure.

In addition, the procedures described in the above embodiments may be handled as methods including those procedures or may be handled as a program for causing a computer to execute those procedures or a recording medium that stores the program. As the recording medium, a CD (compact disc), an MD (minidisc), a DVD (digital versatile disk), a memory card, a Blu-ray disc (registered trademark), or the like can be used.

It should be noted that the present disclosure can take the following configurations.

(1) A storage control apparatus, including:
a standard read request unit configured to issue a request for a read with standard accuracy to a read address in a memory;
an error correcting unit configured to perform error correction on the basis of an error correcting code and data returned by the memory in response to the read request with the standard accuracy; and
a high-accuracy read request unit configured to issue, when an error incapable of being corrected by the error correction is caused, a request again for a read with higher accuracy than the standard accuracy to the read address.

(2) The storage control apparatus according to Item (1), further including
a recording unit configured to record the read address in a case where errors are entirely corrected by the error correction, and a bit count of the errors corrected satisfies a certain requirement, in which
when a new read address in accordance with a new read request is recorded in the recording unit, the read request with the high accuracy is issued to the new read address without issuing the read request with the standard accuracy.

(3) The storage control apparatus according to Item (2), in which
when the bit count of the errors corrected exceeds a predetermined threshold value, the recording unit determines that the certain requirement is satisfied and records the read address.

(4) The storage control apparatus according to any one of Items (1) to (3), in which
when the read address corresponds to a predetermined address area, the read request with the high accuracy is issued to the read address without issuing the read request with the standard accuracy.

(5) The storage control apparatus according to Item (4), in which
the predetermined address area is a system area.

(6) The storage control apparatus according to any one of Items (1) to (5), in which
the error correcting unit performs the error correction for data having a first size on the basis of a first error correcting code and performs the error correction for data having a second size larger than the first size on the basis of a second error correcting code with a higher correction capability than the first error correcting code, and
when the read request to the read address has a size equal to or smaller than the first size, the read request with the high accuracy is issued to the read address without issuing the read request with the standard accuracy.

(7) The storage control apparatus according to any one of Items (1) to (6), in which
when an access frequency to the read address satisfies a certain requirement, the read request with the high accuracy is issued to the read address without issuing the read request with the standard accuracy.

(8) The storage control apparatus according to any one of Items (1) to (7), further including
a refreshing request unit configured to issue a refreshing request to the read address in a case where errors are entirely corrected by the error correction, and a bit count of the errors corrected satisfies a certain requirement.

(9) The storage control apparatus according to Item (8), in which
the refreshing request unit gives, as the refreshing request, an instruction to perform a read with the higher accuracy than the standard accuracy in the read address to write a read result in the read address.

(10) A storage apparatus, including:
a memory configured to deal with a read request for both of a read with standard accuracy and a read with higher accuracy than the standard accuracy;
a standard read request unit configured to issue a request for the read with the standard accuracy to a read address in the memory;
an error correcting unit configured to perform error correction on the basis of an error correcting code and data returned by the memory in response to the read request with the standard accuracy; and a high-accuracy read request unit configured to issue, when an error incapable of being corrected by the error correction is caused, a request again for a read with higher accuracy than the standard accuracy to the read address.

(11) An information processing system, including:

a memory configured to deal with a read request for both of a read with standard accuracy and a read with higher accuracy than the standard accuracy;

a host computer configured to issue a read access to the memory;

a standard read request unit configured to issue a request for the read with the standard accuracy to a read address in the memory in response to the read access;

an error correcting unit configured to perform error correction on the basis of an error correcting code and data returned by the memory in response to the read request with the standard accuracy; and a high-accuracy read request unit configured to issue, when an error incapable of being corrected by the error correction is caused, a request again for a read with higher accuracy than the standard accuracy to the read address.

(12) A storage control method, including:

issuing a request for a read with standard accuracy to a read address in a memory;

performing error correction on the basis of an error correcting code and data returned by the memory in response to the read request with the standard accuracy; and issuing, when an error incapable of being corrected by the error correction is caused, a request again for a read with higher accuracy than the standard accuracy to the read address.

It should be understood by those skilled in the art that various modifications, combinations, sub-combinations and alterations may occur depending on design requirements and other factors insofar as they are within the scope of the appended claims or the equivalents thereof.

What is claimed is:

1. A storage control apparatus, comprising:
one or more processors configured to:
issue a request for a read with standard accuracy to a read address in a memory;
perform error correction on the basis of an error correcting code and data returned by the memory in response to the read request with the standard accuracy;
issue, when an error incapable of being corrected by the error correction is caused, a request again for a read with higher accuracy than the standard accuracy to the read address; and
record the read address in a case where errors are entirely corrected by the error correction and a bit count of the errors corrected satisfies a first certain requirement.

2. The storage control apparatus according to claim 1, wherein
when a new read address in accordance with a new read request is recorded, the read request with the high accuracy is issued to the new read address without issuing the read request with the standard accuracy.

3. The storage control apparatus according to claim 1, wherein
when the bit count of the errors corrected exceeds a predetermined threshold value, the one or more processors are configured to determine that the certain requirement is satisfied and record the read address.

4. The storage control apparatus according to claim 1, wherein
when the read address corresponds to a predetermined address area, the read request with the high accuracy is issued to the read address without issuing the read request with the standard accuracy.

5. The storage control apparatus according to claim 4, wherein the predetermined address area is a system area.

6. The storage control apparatus according to claim 1, wherein
when an access frequency to the read address satisfies a second certain requirement, the read request with the high accuracy is issued to the read address without issuing the read request with the standard accuracy.

7. The storage control apparatus according to claim 1, wherein
the one or more processors are further configured to issue a refreshing request to the read address in a case where errors are entirely corrected by the error correction, and a bit count of the errors corrected satisfies a third certain requirement.

8. The storage control apparatus according to claim 7, wherein
the one or more processors are configured to give, as the refreshing request, an instruction to perform a read with the higher accuracy than the standard accuracy in the read address to write a read result in the read address.

9. A storage control apparatus, comprising:
one or more processors configured to:
issue a request for a read with standard accuracy to a read address in a memory;
perform error correction on the basis of an error correcting code and data returned by the memory in response to the read request with the standard accuracy; and
issue, when an error incapable of being corrected by the error correction is caused, a request again for a read with higher accuracy than the standard accuracy to the read address,
wherein the one or more processors are configured to perform the error correction for data having a first size on the basis of a first error correcting code and perform the error correction for data having a second size larger than the first size on the basis of a second error correcting code with a higher correction capability than the first error correcting code, and
when the read request to the read address has a size equal to or smaller than the first size, the read request with the high accuracy is issued to the read address without issuing the read request with the standard accuracy.

10. A storage apparatus, comprising:
a memory configured to deal with a read request for both of a read with standard accuracy and a read with higher accuracy than the standard accuracy; and
one or more processors configured to:
issue a request for the read with the standard accuracy to a read address in the memory;
perform error correction on the basis of an error correcting code and data returned by the memory in response to the read request with the standard accuracy;
issue, when an error incapable of being corrected by the error correction is caused, a request again for a read with higher accuracy than the standard accuracy to the read address; and
record the read address in a case where errors are entirely corrected by the error correction and a bit count of the errors corrected satisfies a certain requirement.

11. The storage apparatus according to claim 10, wherein when a new read address in accordance with a new read request is recorded, the read request with the high accuracy is issued to the new read address without issuing the read request with the standard accuracy.

12. An information processing system, comprising:
a memory configured to deal with a read request for both of a read with standard accuracy and a read with higher accuracy than the standard accuracy;
a host computer configured to issue a read access to the memory; and
one or more processors configured to:
issue a request for the read with the standard accuracy to a read address in the memory in response to the issuance of the read access;
perform error correction on the basis of an error correcting code and data returned by the memory in response to the read request with the standard accuracy;
issue, when an error incapable of being corrected by the error correction is caused, a request again for a read with higher accuracy than the standard accuracy to the read address; and
record the read address in a case where errors are entirely corrected by the error correction and a bit count of the errors corrected satisfies a certain requirement.

13. The information processing system according to claim 12, wherein when a new read address in accordance with a new read request is recorded the read request with the high accuracy is issued to the new read address without issuing the read request with the standard accuracy.

14. A storage control method, comprising:
issuing a request for a read with standard accuracy to a read address in a memory;
performing error correction on the basis of an error correcting code and data returned by the memory in response to the read request with the standard accuracy; and
issuing, when an error incapable of being corrected by the error correction is caused, a request again for a read with higher accuracy than the standard accuracy to the read address,
wherein the error correction for data having a first size is performed on the basis of a first error correcting code and the error correction for data having a second size larger than the first size is performed on the basis of a second error correcting code with a higher correction capability than the first error correcting code, and
when the read request to the read address has a size equal to or smaller than the first size, the read request with the high accuracy is issued to the read address without issuing the read request with the standard accuracy.

15. A storage control method, comprising:
issuing a request for a read with standard accuracy to a read address in a memory;
performing error correction on the basis of an error correcting code and data returned by the memory in response to the read request with the standard accuracy;
issuing, when an error incapable of being corrected by the error correction is caused, a request again for a read with higher accuracy than the standard accuracy to the read address; and
recording the read address in a case where errors are entirely corrected by the error correction and a bit count of the errors corrected satisfies a certain requirement.

16. The storage control method according to claim 15, wherein when a new read address in accordance with a new read request is recorded, the read request with the high accuracy is issued to the new read address without issuing the read request with the standard accuracy.

* * * * *